United States Patent
Yamashita et al.

(10) Patent No.: US 10,497,850 B2
(45) Date of Patent: Dec. 3, 2019

(54) THERMOELECTRIC CONVERTER AND MANUFACTURING METHOD FOR MANUFACTURING THERMOELECTRIC CONVERTER

(71) Applicant: MITSUBISHI ELECTRIC CORPORATION, Chiyoda-ku (JP)

(72) Inventors: Akira Yamashita, Chiyoda-ku (JP); Kaoru Motonami, Chiyoda-ku (JP); Nobuo Fujiwara, Chiyoda-ku (JP); Hidetada Tokioka, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/303,644

(22) PCT Filed: Aug. 25, 2014

(86) PCT No.: PCT/JP2014/072167
§ 371 (c)(1),
(2) Date: Oct. 12, 2016

(87) PCT Pub. No.: WO2015/166595
PCT Pub. Date: Nov. 5, 2015

(65) Prior Publication Data
US 2017/0040522 A1 Feb. 9, 2017

(30) Foreign Application Priority Data
May 1, 2014 (JP) .................... 2014-094692

(51) Int. Cl.
*H01L 35/10* (2006.01)
*F01N 5/02* (2006.01)
(Continued)

(52) U.S. Cl.
CPC .............. *H01L 35/32* (2013.01); *F01N 5/025* (2013.01); *H01L 35/10* (2013.01); *H01L 35/34* (2013.01);
(Continued)

(58) Field of Classification Search
CPC .......... H01L 35/10; H01L 35/16; H01L 35/18; H01L 35/20; H01L 35/32; H01L 35/34; F01N 5/25
See application file for complete search history.

(56) References Cited

U.S. PATENT DOCUMENTS 5,917,144 A 6/1999 Miyake et al.
2006/0102223 A1 5/2006 Chen et al.
(Continued)

FOREIGN PATENT DOCUMENTS

CN 1773740 A 5/2006
DE 10 2014 100 106 A1 7/2014
(Continued)

OTHER PUBLICATIONS

Office Action dated May 2, 2018 in Chinese Patent Application No. 201480078505.8 with English translation, 14 pages.
(Continued)

*Primary Examiner* — Matthew T Martin
(74) *Attorney, Agent, or Firm* — Oblon, McClelland, Maier & Neustadt, L.L.P.

(57) ABSTRACT

A thermoelectric converter includes a substrate and two thermoelectric elements that may include a flat portion and a concave portion. The thermoelectric elements each include one end that contacts with the thermoelectric element and an other end that contacts with thermoelectric element at a bottom surface of the concave portion. The thermoelectric elements are each positioned to be suspended across a space defined by the concave portion. The thermoelectric converter can be manufactured through photolithographic process, and can be incorporated into an exhaust gas recirculation device.

12 Claims, 21 Drawing Sheets

(51) Int. Cl.
  *H01L 35/32* (2006.01)
  *H01L 35/34* (2006.01)
  *H01L 35/16* (2006.01)
  *H01L 35/18* (2006.01)
  *H01L 35/20* (2006.01)

(52) U.S. Cl.
  CPC .............. *H01L 35/16* (2013.01); *H01L 35/18* (2013.01); *H01L 35/20* (2013.01)

(56) References Cited

U.S. PATENT DOCUMENTS

2014/0190542 A1* 7/2014 Lane ........................ H01L 35/32
                                                              136/212
2015/0158737 A1* 6/2015 Choi ..................... C04B 35/453
                                                              252/62.3 T

FOREIGN PATENT DOCUMENTS

| | | |
|---|---|---|
| JP | 4-101472 A | 4/1992 |
| JP | 6-338636 A | 12/1994 |
| JP | 10-303469 A | 11/1998 |
| JP | 10-321920 A | 12/1998 |
| JP | 2005-328000 A | 11/2005 |

OTHER PUBLICATIONS

International Preliminary Report on Patentability and Written Opinion dated Nov. 10, 2016 in PCT/JP2014/072167 (submitting English translation only).
German Office Action dated Oct. 9, 2018 in Patent Application No. 11 2014 006 636.2 (with English translation), 14 pages.
Toshiki Tsubota, et al., "Thermoelectric Properties of ZnO Doped with the Group 13 Elements", 16th International Conference on Thermoelectrics, 1997, pp. 240-243.
International Search Report dated Oct. 28, 2014, in PCT/JP2014/072167 filed Aug. 25, 2014.

* cited by examiner (S5)

(S6)

(S7)

(S8)

(S13)

(S14)

(S15)

(S26)

(S27)

(S28)

(S29)

US 10,497,850 B2

THERMOELECTRIC CONVERTER AND MANUFACTURING METHOD FOR MANUFACTURING THERMOELECTRIC CONVERTER

TECHNICAL FIELD

The present invention relates to a thermoelectric converter for generating electricity by Seebeck effect or for causing temperature difference by Peltier effect, and a method for manufacturing the thermoelectric converter.

BACKGROUND ART

A thermoelectric converter, specifically so-called a bulk type thermoelectric converter, is known which includes pillar-shaped p-type and n-type thermoelectric elements provided one after the other and connected to each other by electrodes. When a large amount of heat is input into or output from the thermoelectric converter, a difference of linear expansion coefficients between the thermoelectric elements and the electrodes causes thermal stress therebetween, which may in turn damage the thermoelectric elements.

In view of this situation, a bulk type thermoelectric converter disclosed in Patent Document 1 includes an electrode which connects p-type and n-type thermoelectric elements and has a cut-out portion therein so as to absorb thermal stress by allowing the electrode to be deflected (See FIG. 4).

PRIOR ART DOCUMENTS

Patent Documents

Patent Document 1: JP H10-321920 A

SUMMARY OF THE INVENTION

Problems to be Solved by the Invention

The thermoelectric converter disclosed in Patent Document 1 may cause some problems. First, a bulk type thermoelectric converter is not suitable for mass production because it has to be assembled by an alignment and a connection of each of thermoelectric elements which is produced individually.

Second, due to a difference of linear expansion coefficients between p-type and n-type thermoelectric elements, a thermoelectric element having a lower linear expansion coefficient on contact points at a higher temperature side (or a heat dissipation side) may have smaller contact area than that at a lower temperature side (or a heat absorbing side). For example, if thermoelectric generation is performed in this situation, the thermoelectric element may not receive sufficient heat, thereby substantially reducing electric generation efficiency. In order to suppress this second problem, it may be possible to press the thermoelectric elements onto the contact points in order to secure the contact area sufficiently, however, the thermoelectric elements may likely be damaged upon activation of the thermoelectric converter.

The present invention is made in regard to the above problems to be solved. An object of one aspect of the invention is to provide a thermoelectric converter which can be manufactured at a low cost and has a high reliability.

Means for Solving the Problems

In order to accomplish the above object, a thermoelectric converter according to the first aspect of the present invention comprises a substrate including first and second regions having different heights each other, and a thermoelectric element including higher and lower temperature ends which are in contact with the first and second regions, respectively. The thermoelectric element includes a bridge which is suspended across a space defined between the first and second regions.

In a preferable embodiment of the first aspect of the present invention, the substrate may include a flat portion and a concave portion, and one of the first and second regions may be provided on the flat portion and the other one of the first and second regions may be provided on a bottom surface of the concave portion.

In a preferable embodiment of the first aspect of the present invention, one of the higher and lower temperature ends of the thermoelectric element is in contact with another thermoelectric element having a conductivity type different from one of the thermoelectric element, and the other of higher and lower temperature ends is in contact with a conductor.

In a preferable embodiment of the first aspect of the present invention, the substrate may be a silicon-on-insulator substrate including two silicon layers and an insulating layer sandwiched between the two silicon layers, and wherein upper surfaces of the two silicon layers may have crystalline orientations which are different from each other.

In a preferable embodiment of the first aspect of the present invention, the thermoelectric converter may be provided between a higher temperature pipe connected to an exhaust pipe of an engine and a lower temperature pipe through which coolant passes.

In a preferable embodiment of the first aspect of the present invention, the thermoelectric element may include a p-type thermoelectric material selected from the group consisting of 1) Ag-doped $Mg_2Si$, 2) Mn-doped or Al-doped $\beta$-$FeSi_2$, 3) $MnSi_2$, 4) FeSb based material, and 5) PbTe based material, or an n-type thermoelectric material selected from the group consisting of Al-doped, Sb-doped or Bi-doped $Mg_2Si$, 2) Co-doped, Ni-doped or B-doped $\beta$-$FeSi_2$, 3) $CoSi_2$, 4) CoSb based material, and 5) PbTe based material In a preferable embodiment of the first aspect of the present invention, the thermoelectric element may include an oxide which is stable under high temperature such as ZnO in which Al or $In_2O_3$ is doped.

In a preferable embodiment of the first aspect of the present invention, the bridge of the thermoelectric element includes a cut-out portion.

In a preferable embodiment of the first aspect of the present invention, the bridge of the thermoelectric element may extend in a meandering way when viewed from the top thereof.

In a preferable embodiment of the first aspect of the present invention, the thermoelectric element may include one selected from the group consisting of a bent portion and a curved portion formed in the bridge.

A method for manufacturing a thermoelectric converter according to the second aspect of the present invention comprises the steps of preparing a substrate, performing an anisotropic etching on the substrate, depositing a thermoelectric material on the substrate, performing an anisotropic etching on the substrate to form a concave portion therein so that the thermoelectric material is suspended across in the concave portion.

Effects of the Invention

According to the present invention where the bridge of the thermoelectric element is suspended across a space defined between the first and second regions, thermal stress applied to the thermoelectric element is absorbed by a deflection of the thermoelectric element within the space. This decreases thermal stress applied to higher and lower temperature ends of the thermoelectric element. Further, the thermoelectric converter can be manufactured through a photomechanical or photolithographic process. As such, a thermoelectric converter is provided which can be manufactured at a low cost and has a high reliability.

EMBODIMENTS OF THE INVENTION

A thermoelectric converter according to the present invention will be discussed below with reference to attached drawings. Throughout figures, the same or similar components are denoted by the same reference number. It should be noted that terms such as "top" and "bottom" each showing a direction are conveniently used for facilitating the present invention and not intended to limit the direction to mount or install a thermoelectric converter. Duplicated descriptions in the succeeding embodiments will be omitted for clarifying each of the embodiments.

In the present disclosure, a thermoelectric material used in a thermoelectric converter may be referred to as a thermoelectric element (or a thermoelectric converting element) herein.

First Embodiment

Figure 1:
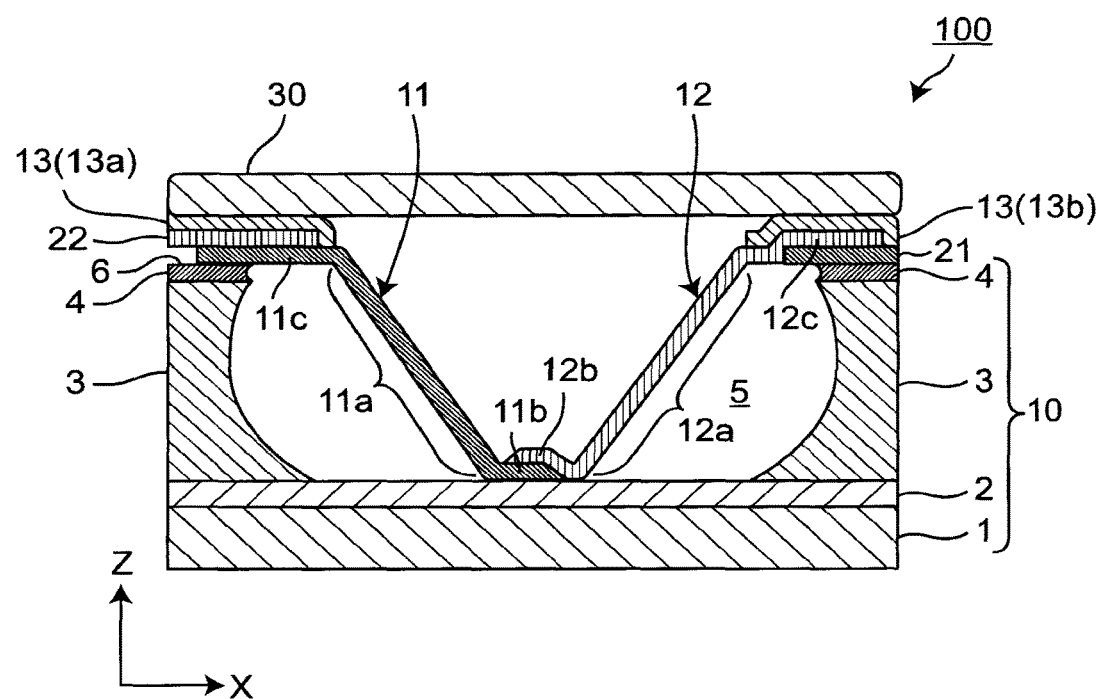
FIG. 1 is a cross sectional view of one unit of a thermoelectric converter according to the first embodiment of the present invention.
Figure 2:
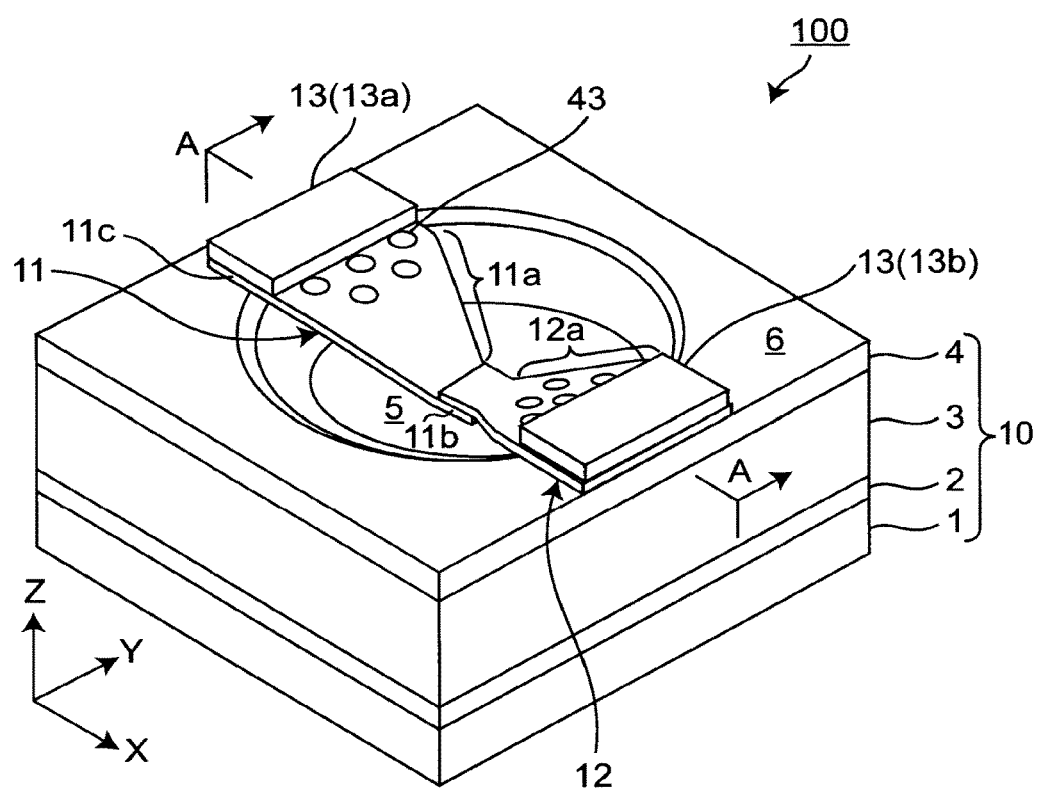
FIG. 2 is a perspective view of one unit of the thermoelectric converter according to the first embodiment of the present invention.

FIGS. 1 and 2 depict a cross sectional view and a perspective view of one unit of a thermoelectric converter according to the first embodiment of the present invention, respectively. FIG. 1 is a cross sectional view taken along A-A line shown in FIG. 2 and viewed from the arrow direction (toward a positive y-direction). In those figures, a positive z-direction may be referred to as upper direction and a negative z-direction may be referred to as lower direction. One unit of the thermoelectric converter 100 includes a substrate 10, two thermoelectric elements 11, 12 provided on the substrate, and electrodes 13a, 13b electrically connected to the thermoelectric elements 11, 12, respectively.

As depicted in FIG. 1, a lid or metal foil 30 is provided on the electrode 13. The lid 30 is not illustrated in FIG. 2. As depicted in FIG. 2, through holes 43 are formed in the thermoelectric elements 11, 12 during the manufacturing process thereof. The through holes 43 are not shown in FIG. 1.

The substrate 10 includes a metal foil 1, a lower insulating film 2, a Si layer (silicon layer) 3 and an upper insulating film 4, which are stacked in this order from bottom to top. Each of the lower and upper insulating films 2, 4 may be a $SiO_2$ film. The Si layer 3 is positioned so that its upper surface is (100) surface. The substrate 10 has a concave portion 5 formed therein. The concave portion 5 has a circular shape when viewed from the upper side. The concave portion 5 may have other shapes, e.g. a rectangle shape when viewed from the upper side. An upper surface of the insulating film 2 is exposed through the concave portion 5. Hereinafter, a part of an upper surface of the substrate 10, in which the concave portion 5 is not formed, is called a flat portion 6.

One of the two thermoelectric elements 11, 12 is a p-type thermoelectric element made of p-type thermoelectric material and the other one of them is an n-type thermoelectric element made of n-type thermoelectric material.

The p-type thermoelectric material may be, for example, 1) Ag-doped $Mg_2Si$; 2) Mn-doped or Al-doped $\beta$-$FeSi_2$; 3) $MnSi_2$; 4) FeSb based material such as $LaFe_4Sb_{12}$, $CeFe_4Sb_{12}$ or $YbFe_4Sb_{12}$; and 4) Na-doped K-doped or Ag-doped PbTe based material. The n-type thermoelectric material may be, for example, Al-doped, Sb-doped or Bi-doped $Mg_2Si$; 2) Co-doped, Ni-doped or B-doped $\beta$-$FeSi_2$;

3) $CoSi_2$; 4) CoSb based material such as $LaCo_4Sb_{12}$, $CeCo_4Sb_{12}$, $YbCo_4Sb_{12}$; and 5) PbTe based material in which material such as $PbI_2$ is doped. The n-type thermoelectric material includes an oxide such as ZnO in which Al or $In_2O_3$ is doped in view of an advantage that it has a high stability at high temperature.

As depicted in FIG. 1, the thermoelectric element 11 has a bridge 11a which is suspended across a space defined between a flat portion 6 and a bottom surface of a concave portion 5, so that the bridge 11a is supported in midair in the hollow concave portion 5. The thermoelectric element 11 has a lower end 11b which is supported by the lower insulating film 2 on the bottom surface of the concave portion 5 and an upper end 11c which is supported by the substrate 10 (specifically, the upper insulating film 4) with the upper end 11c overhanging from the surface of the substrate 10 toward the inside of the concave portion 5. The lower and upper ends 11b, 11c are connected to each other via the bridge 11a. The thermoelectric element 12 also has a bridge 12a, a lower end 12b and an upper end 12c.

Figure 3:
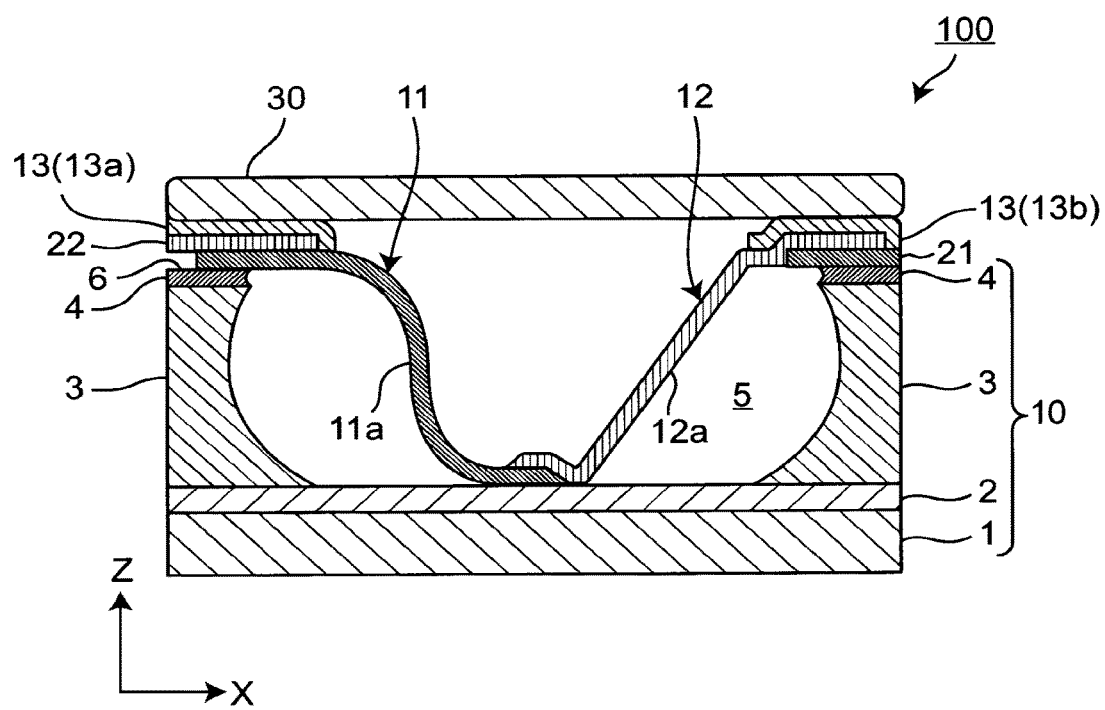
FIG. 3 is a cross sectional view corresponding to FIG. 1 depicting the thermoelectric element deflected in response to thermal stress.

As depicted in FIG. 3, the thermoelectric elements 11, 12 are configured to be flexible within the concave portion 5 upon receiving thermal stress (compressive stress). The thermoelectric elements 11, 12 are preferably thin films each having the thickness between about 0.2 micron and a few microns for securing its sufficient flexibility.

Figure 4:
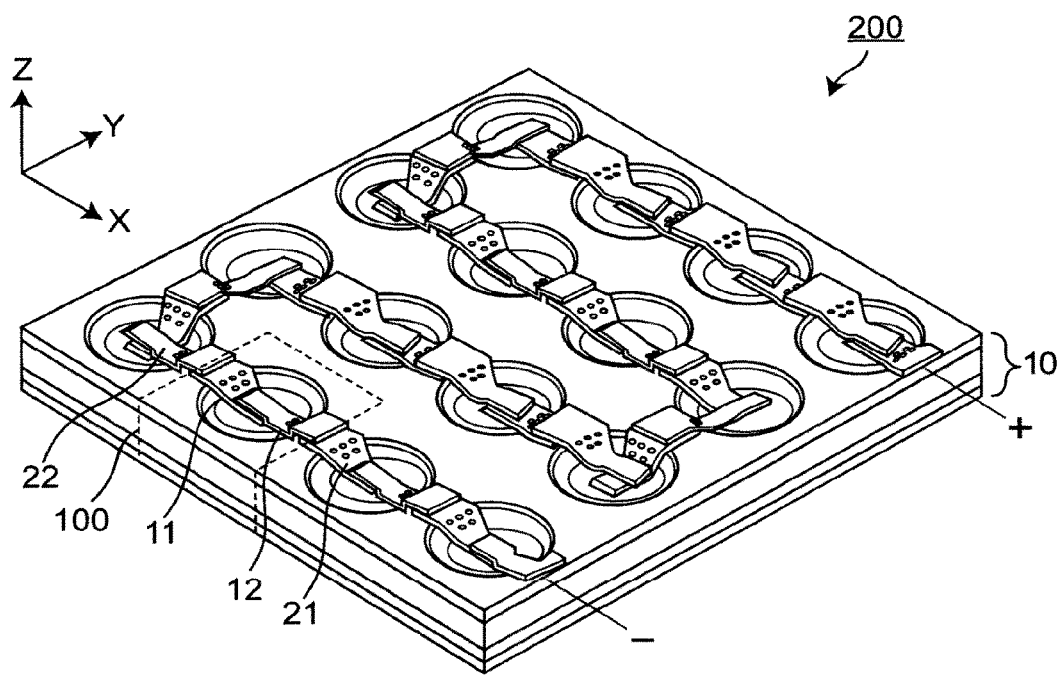
FIG. 4 is a schematic perspective view of a thermoelectric converter according to the first embodiment of the present invention.

FIG. 4 is a schematic perspective view of the thermoelectric converter according to the first embodiment of the present invention. The thermoelectric converter 200, in general, includes a plurality of the thermoelectric elements 11, 12 connected to each other in series, each of which is illustrated by a dotted line of FIG. 4 and defined as a unit 100 shown in FIG. 2. The thermoelectric elements 11, 12 (21, 22) of the unit 100 aligned in series in x-direction in FIG. 4 are arranged to oppose each other as depicted in FIGS. 1 and 2. Another unit of the thermoelectric converter having the thermoelectric elements 21, 22 is the adjacent unit of the thermoelectric converter having the thermoelectric elements 11, 12. The thermoelectric elements 21, 22 have the same conductive type as the thermoelectric elements 11, 12, respectively. On the other hand, one of the thermoelectric elements extending in y-direction is arranged offset in x-direction by 90 degrees relative to the other one of them in the same unit 100.

In the thermoelectric converter 200, one of the metal foil 1 and the lid 30 (not shown in FIG. 4) contacts with a higher temperature source, while the other one of them contacts with the lower temperature source. This generates a potential difference between ends (higher and lower temperature ends) of the thermoelectric elements 11, 12 (21, 22). Alternatively, the thermoelectric elements within different units 100 may be connected each other in parallel.

Referring back to FIG. 1, the unit 100 includes a p-n junction formed on the bottom surface of the concave portion 5 where the lower ends 11b, 12b of the thermoelectric elements 11, 12 are provided one on top of the other. The upper ends 11c, 12c of the thermoelectric elements 11, 12 are provided on the thermoelectric element 21, 22, respectively above the flat portion 6. As mentioned above, the thermoelectric elements, which directly contact with each other, have different conductive types. Specifically, while one of the thermoelectric elements is p-type element, the other is n-type element, and vice versa. As such, the thermoelectric converter 200 includes p-type and n-type thermoelectric elements connected to each other. Yet, in order to have a current running through the thermoelectric converter 200, another feature is required as described below.

Provided on the flat portion 6 are the electrodes 13a, 13b so as to contact with both of the thermoelectric elements 11, 22 (12, 21) provided one on top of the other. This ensures conductivity through the electrodes 13 and the p-n junctions. It should be understood that the electrodes 13 are not necessary to be provided on the flat portion 6, rather may be provided to contact with the thermoelectric elements 11, 21 on the bottom surface of the concave portion 5.

An exemplary method for manufacturing a thermoelectric converter will be described with reference to FIGS. 5 to 8. A series of steps of applying a resist, patterning the resist, etching (e.g. ion beam etching) a bulk material and removing the resist may be collectively referred to as a lithographic process.

Figure 5:
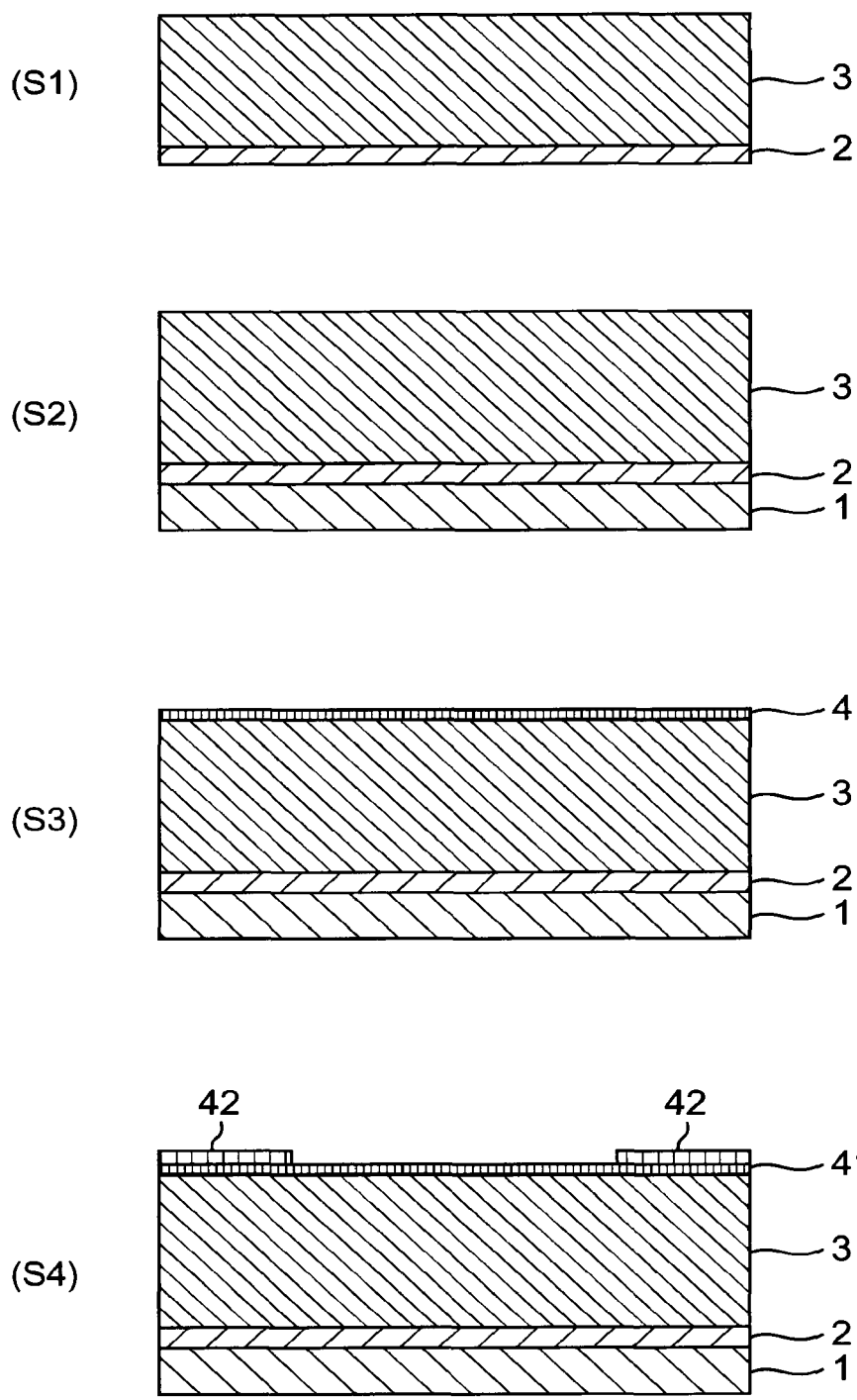
FIG. 5 is a cross sectional view of manufacturing steps S1 to S4 of the thermoelectric converter according to the first embodiment of the present invention.

First, the steps S1 to S4 are described with reference to FIG. 5.

(S1) A lower insulating film 2 is provided on a lower surface of a Si layer 3.

(S2) A metal foil 1 is bonded to a lower surface of the lower insulating film 2.

(S3) An upper surface of the Si layer 3 is oxidized into a $SiO_2$ film 41.

(S4) A resist 42 is applied on the $SiO_2$ film 41 and is patterned (exposed and developed).

Figure 6:
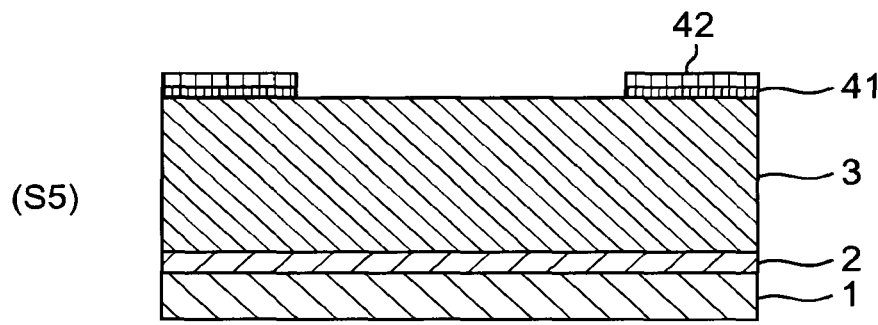
FIG. 6 is a cross sectional view of manufacturing steps S5 to S8 of the thermoelectric converter according to the first embodiment of the present invention.
Figure 6:
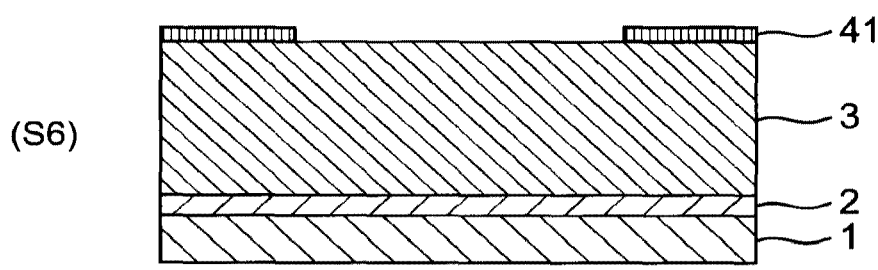
Figure 6:
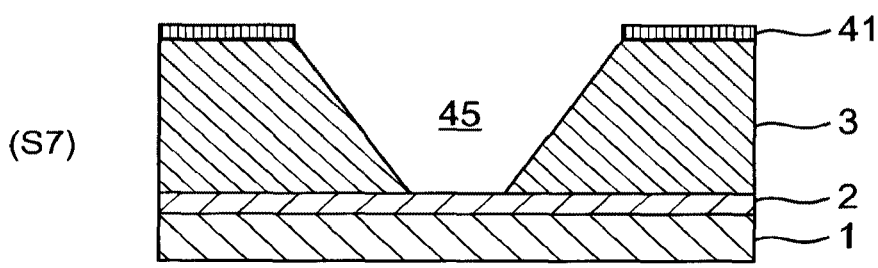
Figure 6:
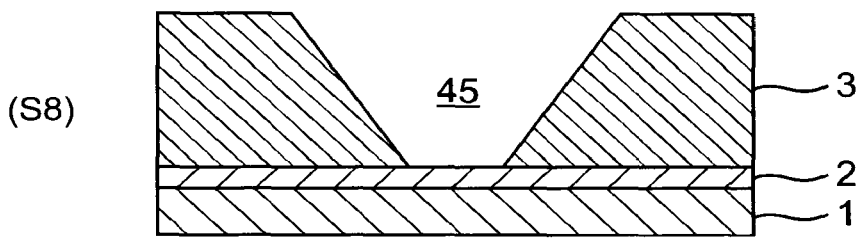

Next, the steps S5 to S8 are described with reference to FIG. 6.

(S5) HF is used to remove the $SiO_2$ film 41.

(S6) Acetone is used to remove the resist 42.

(S7) KOH is used for anisotropic etching on the Si layer 3 and the lower insulating film 2 is used as an etch stop film to partly remove the Si layer 3, which results in a recess 45 formed in the Si layer 3 having an inclined side wall.

(S8) The $SiO_2$ film 41 is fully removed.

Figure 7:
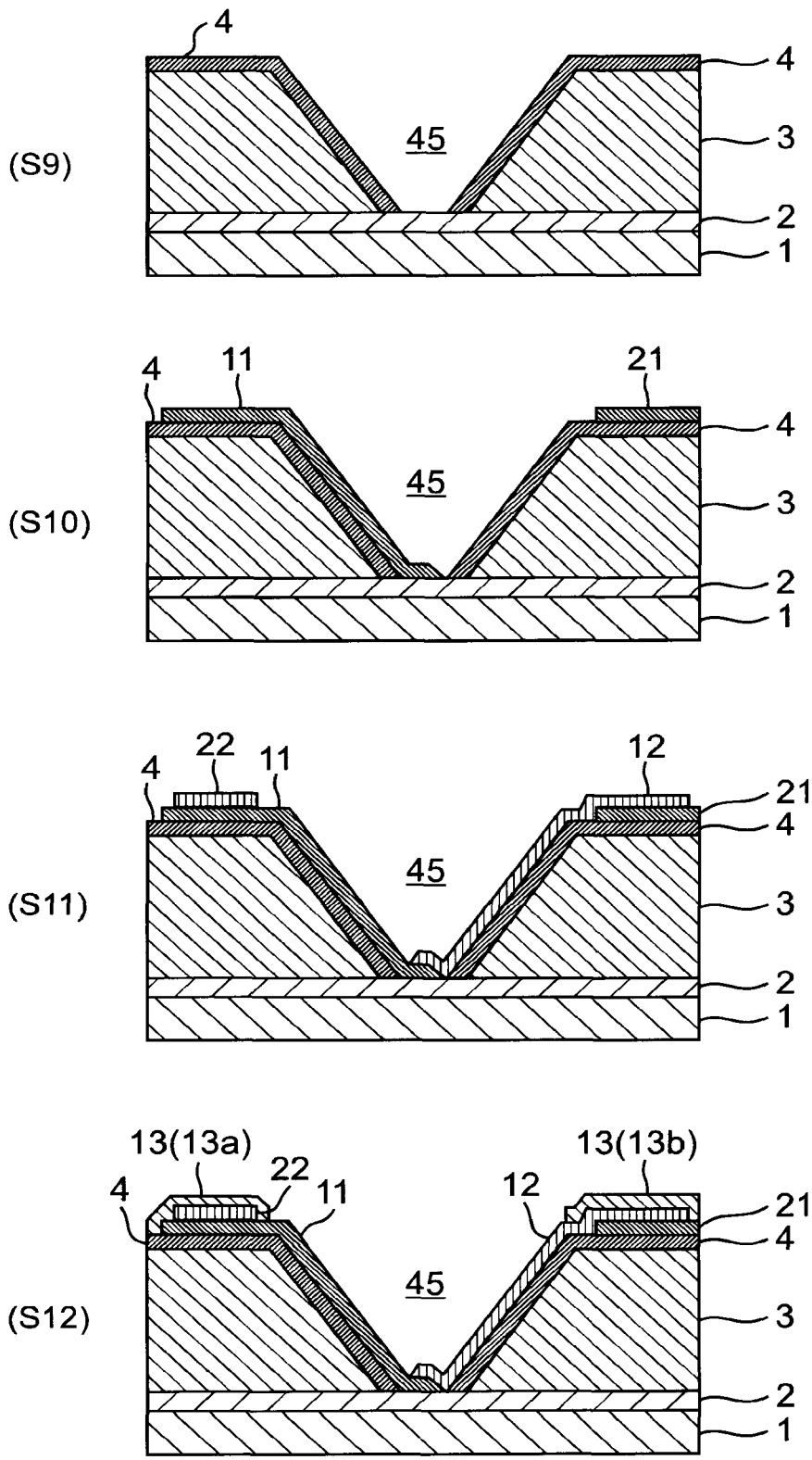
FIG. 7 is a cross sectional view of manufacturing steps S9 to S12 of the thermoelectric converter according to the first embodiment of the present invention.

Next, the steps S9 to S12 are described with reference to FIG. 7.

(S9) A surface of the Si layer 3 is oxidized to form an upper insulating film 4 or a $SiO_2$ film.

(S10) Pulsed Laser Deposition or PLD is performed to deposit p-type or n-type thermoelectric material having a thickness between about 0.2 micron and a few microns. Thermoelectric elements 11 and 21 are subsequently formed using a lithographic process.

(S11) Thermoelectric material is deposited having a conductive type different from that of the thermoelectric material in the step S10, and the thermoelectric elements 12 and 22 are formed through a similar lithographic process to that used in the step S10.

(S12) A conductor such as metal, from which the electrode 13 is made, is deposited on the thermoelectric elements 11, 12 or the thermoelectric elements 21, 22.

Figure 8:
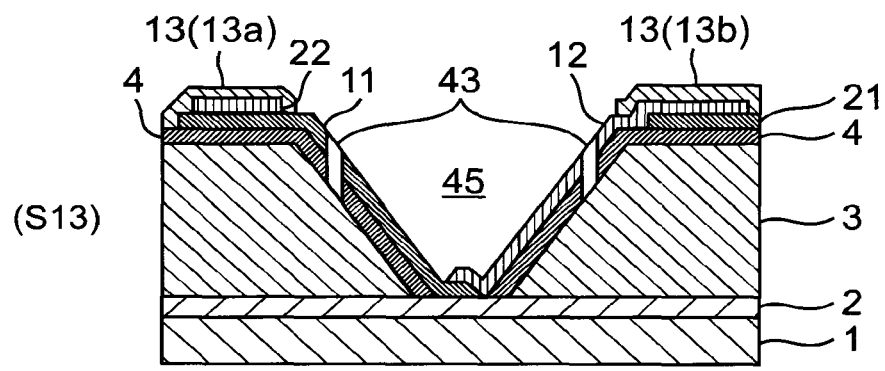
FIG. 8 is a cross sectional view of manufacturing steps S13 to S15 of the thermoelectric converter according to the first embodiment of the present invention.
Figure 8:
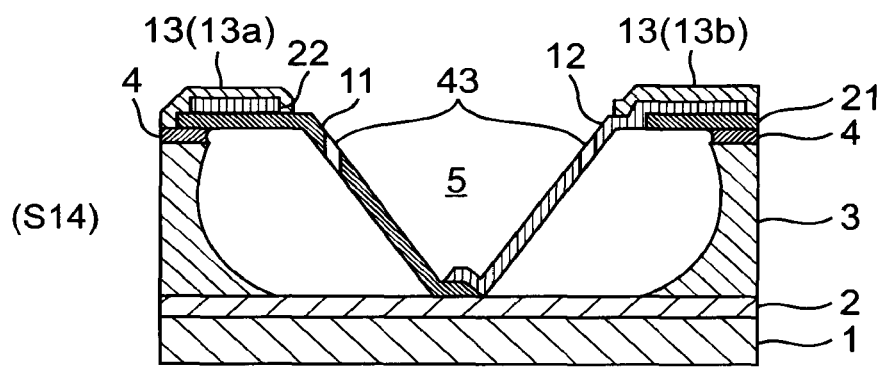
Figure 8:
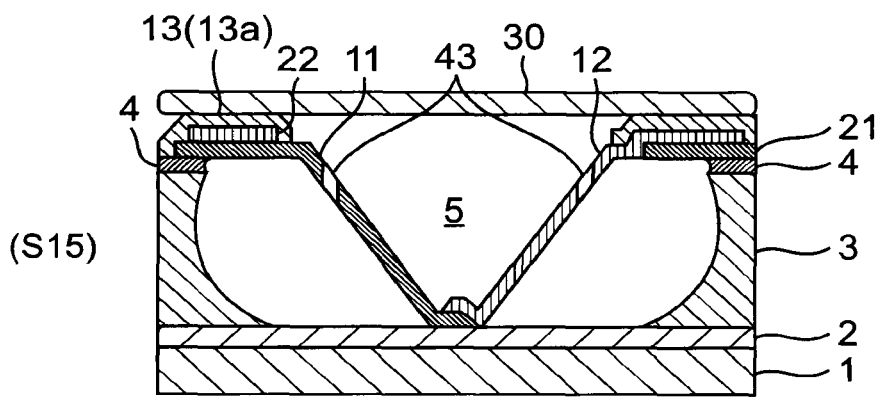

Next, the steps S13 to S15 are described with reference to FIG. 8.

(S13) A through hole 43 is formed in the thermoelectric elements 11, 12 using a lithographic process.

(S14) Etchant is provided below the thermoelectric material via the through hole 43 to perform isotropic etching on the Si layer 3, so that the Si layer 3 and the upper insulating film 4 are partly removed in their portions below the inclined side wall of the recess 45. As such, a concave portion 5 is formed and bridges 11a and 12a of thermoelectric elements 11, 12 are suspended across a space defined within the concave portion 5. In this step, the etchant may be a mixed acid based upon hydrofluoric acid and including an appropriate amount of nitric acid.

(S15) A lid 30 is bonded thereon.

The step S7 of performing isotropic etching may use other types of alkaline etchant. In the steps S10 and S11, the thermoelectric material may be deposited through sputtering.

As a result, the device 200 can be manufactured using a photolithographic process in a highly productive manner.

Also, the bridges 11a, 12a of the thermoelectric elements 11, 12 are suspended across the space defined between the flat portion 6 and the bottom surface of the concave portion 5, so that the bridges 11a, 12a are supported in the hollow concave portion 5. Accordingly, even if the thermoelectric elements 11, 12 expand due to the difference of the linear expansion coefficients therebetween, they deflect within the space to absorb the thermal stress (See FIG. 3). This reduces the thermal stress applied to the thermoelectric elements 11, 12 on their ends (the higher temperature end and the lower temperature end) so as to suppress the deformation of the ends, thereby to maintain electric generation efficiency, without an increased pressing force. Further, this eliminates or substantially reduces deformation on the metal foil 1 and the lid or the metal foil 30, therefore, efficient heat conduction can be achieved during electric generation. As such, an improved reliability of the thermoelectric converter 200 is accomplished.

In general, a thermoelectric element in the form of a thin film manufactured through a photolithographic process tends to have a lower ratio of a thickness (or dimension in z-direction) of the thermoelectric element relative to a thickness of a whole of the thermoelectric converter, which in turn reduces a difference in temperature applied across the thermoelectric elements and consequently an electric energy generated. On the other hand, the thermoelectric converter 200 according to the first embodiment has a higher ratio of heights of the thermoelectric elements 11, 12 to a thickness of the thermoelectric converter 200. This increases a difference in temperature applied across the thermoelectric elements 11, 12 and an electric energy generated.

As depicted in FIG. 1, the thermoelectric elements 11, 12 are extensively overlapped each other at the contact points of the higher temperature side (or a heat dissipation side) and the lower temperature side (or a heat absorbing side), which substantially strengthens the contact points. The thermoelectric elements of this embodiment have reduced contact areas with higher and lower temperature regions (the lid 30 or the lower insulating film 2) when compared to those of a bulk-type thermoelectric converter of which thermoelectric elements have a pillar-structure and have no overlap area to each other. This reduces heat loss through the thermoelectric elements and increases an electric energy generated by the thermoelectric converter 200.

Second Embodiment

Figure 9:
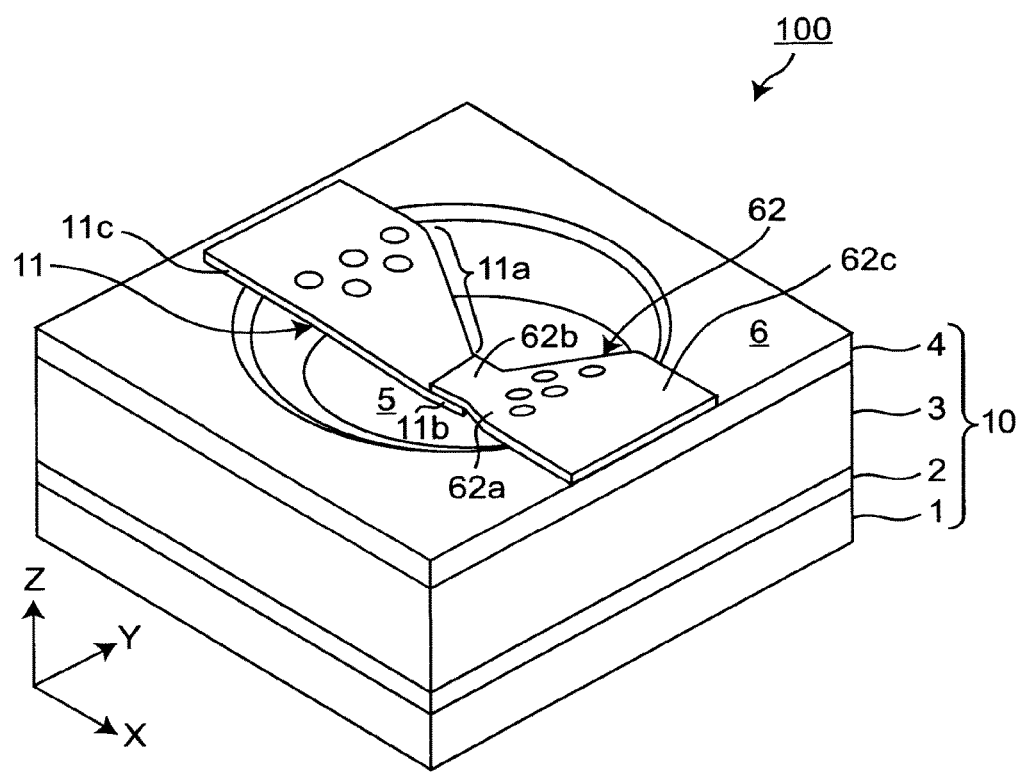
FIG. 9 is a perspective view of one unit of a thermoelectric converter according to the second embodiment of the present invention.

FIG. 9 is a perspective view of one unit of a thermoelectric converter according to the second embodiment of the present invention. Both p-type and n-type thermoelectric elements are used in the first embodiment, while only either one of p-type and n-type thermoelectric elements is used to form a single pole structure in the second embodiment.

In the second embodiment, the thermoelectric element 12 is replaced by a wiring member 62. The wiring member 62 is made of a conductor such as aluminum. This ensures conductivity through the thermoelectric converter 200 as a whole without use of the electrode 13. In the step S11 shown in FIG. 7, a conductive material would be deposited instead of thermoelectric material.

The second embodiment achieves advantages same as or similar to those of the first embodiment except possibly generating reduced electric energy.

Third Embodiment

Figure 10:
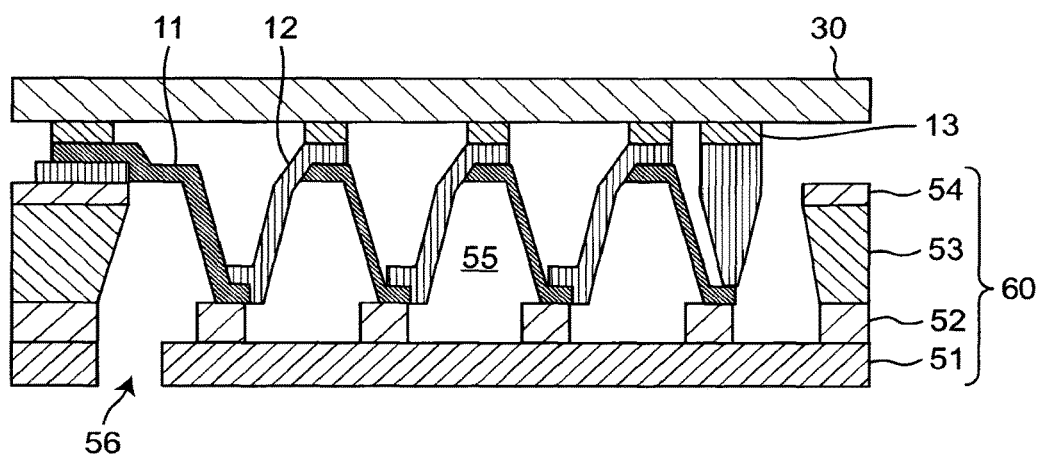
FIG. 10 is a cross sectional view of a part of a thermoelectric converter according to the third embodiment of the present invention.

FIG. 10 is a cross sectional view of a part of a thermoelectric converter according to the third embodiment of the present invention. In the third embodiment, a silicon-on-insulator or an SOI substrate 60 is used. The SOI substrate 60 includes two Si layers 51, 53 bonded together via an oxidation film or an insulating film 52. The two Si layers 51, 53 have upper surfaces having crystalline orientations which are different from each other. Specifically, the Si layer 51 has an upper surface which is (110) surface, while the Si layer 53 has an upper surface which is (100) surface.

An exemplary method for manufacturing the thermoelectric converter 200 according to the third embodiment is described. An anisotropic etching on a Si (100) layer 53 is performed in the same way as the first embodiment and then the thermoelectric elements 11, 12 are formed on the insulating film 54. An opening 56 is formed between a bottom surface of the Si (110) layer 51 and the Si (100) layer 53 through dry etching. Then, a hollow structure is formed in the Si (100) layer 53 making use of a difference in etching rate between (110) surface and (100) surface of silicon.

The third embodiment has advantages which are the same as or similar to those of the first embodiment.

Fourth Embodiment

Figure 11:
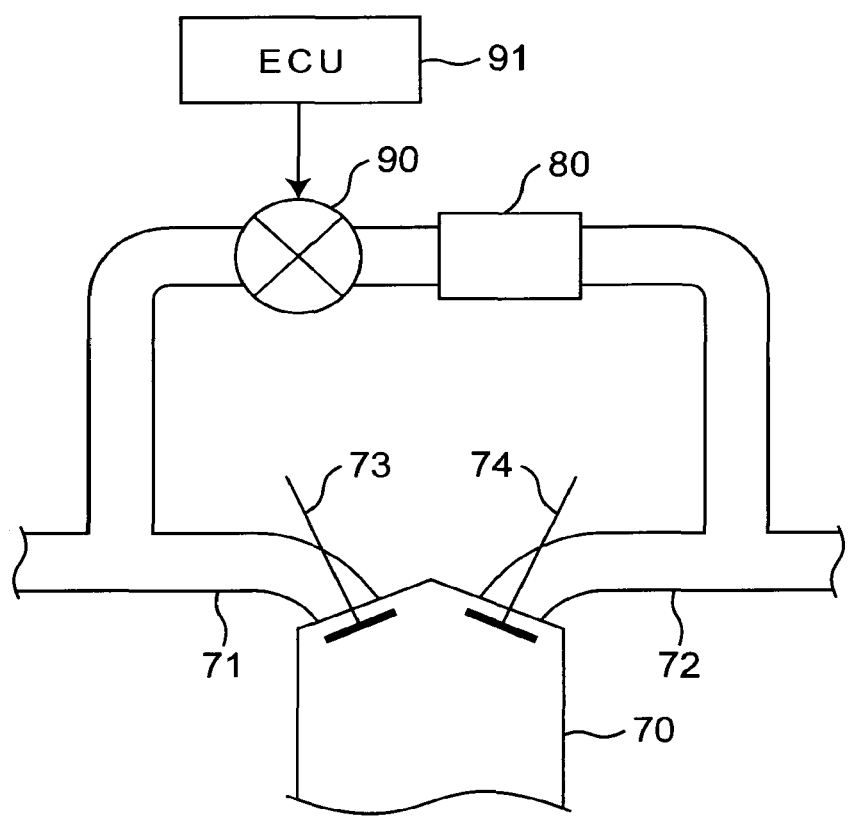
FIG. 11 is a block diagram of an exhaust gas recirculation device.

FIG. 11 is a block diagram of an exhaust gas recirculation device. Some automobiles include an Exhaust Gas Recirculation or EGR device as depicted in FIG. 11 for cleaning exhaust gas or for improving fuel efficiency. In this embodiment, the thermoelectric converter 200 is incorporated in the Exhaust Gas Recirculation device.

The EGR device is configured to recirculate a portion of exhaust gas emitted from an exhaust pipe 72 of an engine 70 to an intake pipe 71 through an exhaust gas recirculation conduit. An amount of exhaust gas for recirculation is determined by an Engine Control Unit or ECU 91 based upon conditions including a traveling condition and is adjusted by an EGR valve 90.

Figure 12:
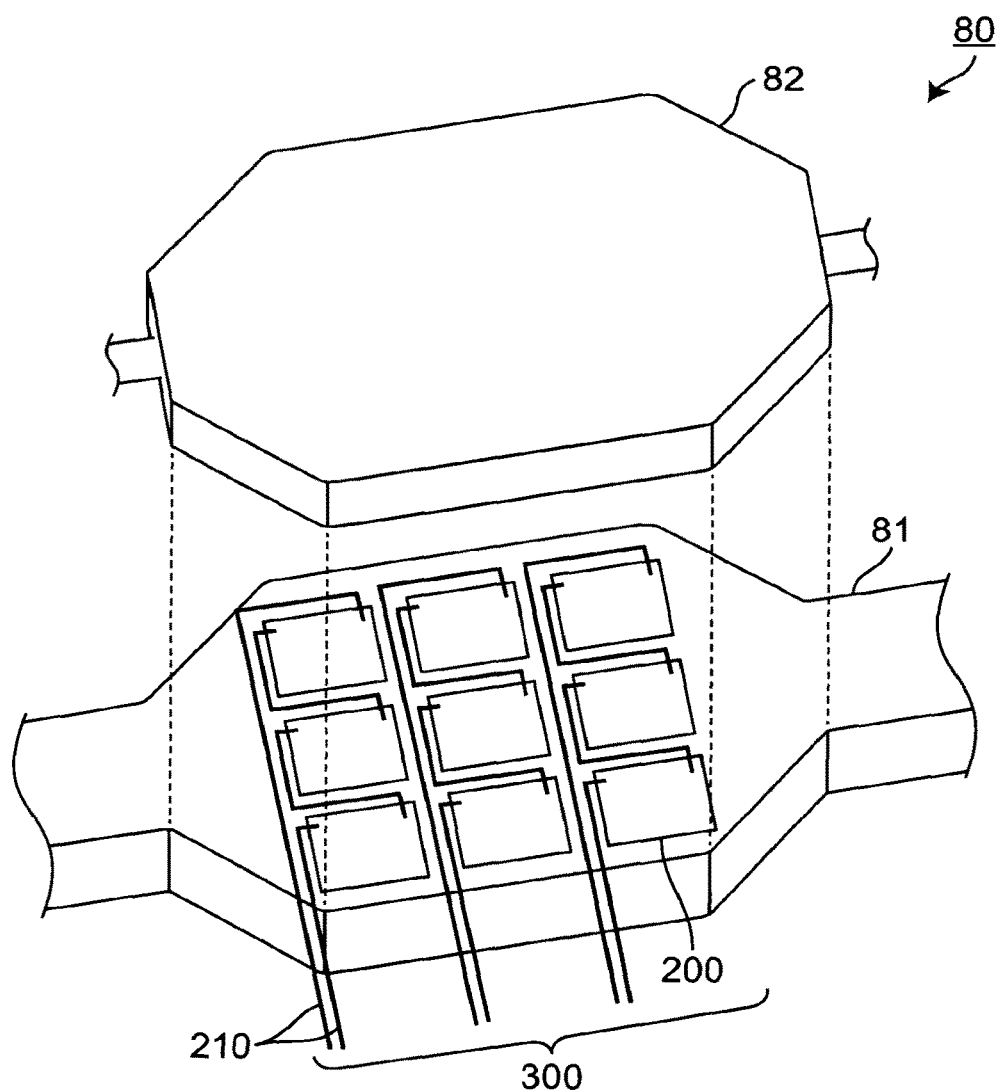
FIG. 12 is a perspective view of an EGR cooler before being assembled.
Figure 13:
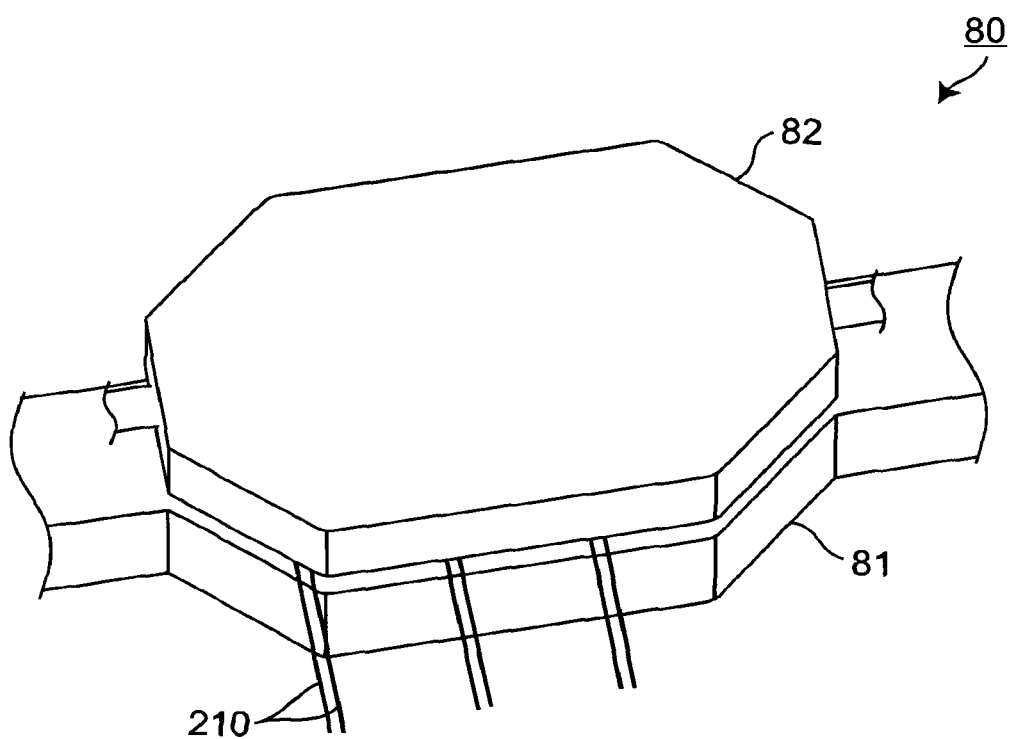
FIG. 13 is a perspective view of the EGR cooler after being assembled.

The exhaust gas recirculation conduit includes an EGR cooler 80 provided thereon. FIGS. 12 and 13 show perspective views of the EGR cooler 80 before and after assembly. The EGR cooler 80 includes a thermoelectric converting module 300 sandwiched between a higher temperature pipe 81 and a lower temperature pipe 82. The higher temperature pipe 81 is connected to the exhaust pipe 72 to guide exhaust gas of high temperature therethrough. The lower temperature pipe 82 guides cooling water or coolant from a radiator therethrough.

A thermoelectric converting module 300 includes three rows of the thermoelectric converters 200, each row including three of the thermoelectric converters 200 connected in series. The lid 30 and the metal foil 1 of the thermoelectric converter 200 are bonded to the higher temperature pipe 81 or the lower temperature pipe 82. The thermoelectric converters 200 are electrically connected to each other by means of wire 210. The way of connection (in series or parallel) and number of the thermoelectric converters 200 may be determined appropriately in accordance with the application and not limited to those as depicted.

Figure 14:
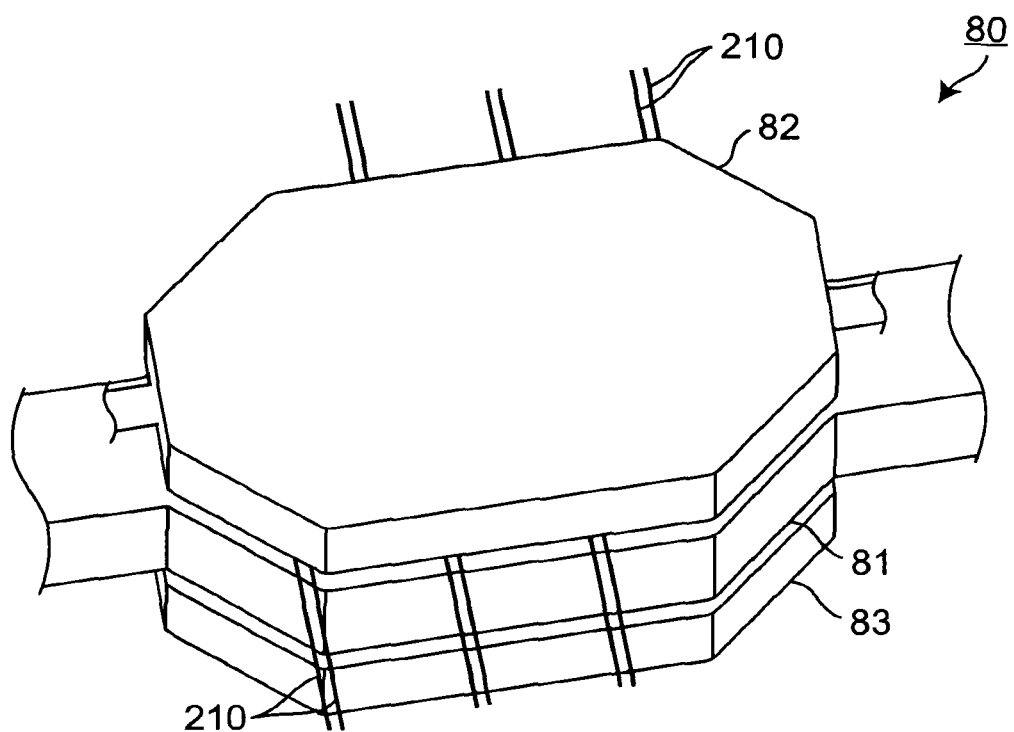
FIG. 14 is a perspective view of an alternative EGR cooler of FIG. 13.
Figure 15:
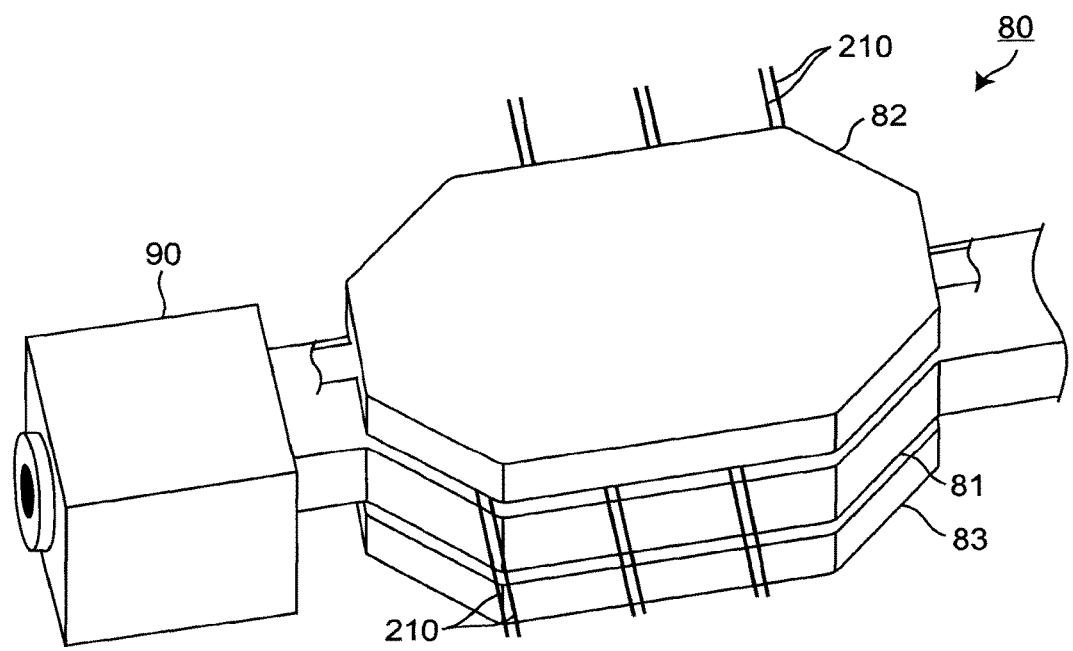
FIG. 15 is a perspective view of the EGR cooler of FIG. 14 attached to an EGR valve.

A pair of the thermoelectric converting modules 300 may be provided on both sides of the higher temperature pipe 81 and sandwiched by the lower temperature pipes 82, 83 as depicted in FIG. 14 so as to obtain a higher electric power. Alternatively, the thermoelectric converting modules 300 may be provided on both sides of the lower temperature pipe 82 (83) and sandwiched by the higher temperature pipes 81. FIG. 15 depicts the EGR cooler 80 attached to the EGR valve 90.

The thermoelectric converting module 300 allows electric energy to be extracted from waste heat energy which is otherwise discarded, thereby reducing load of an on-board alternator or a generator and improving fuel efficiency of the automobile.

Fifth Embodiment

Figure 16:
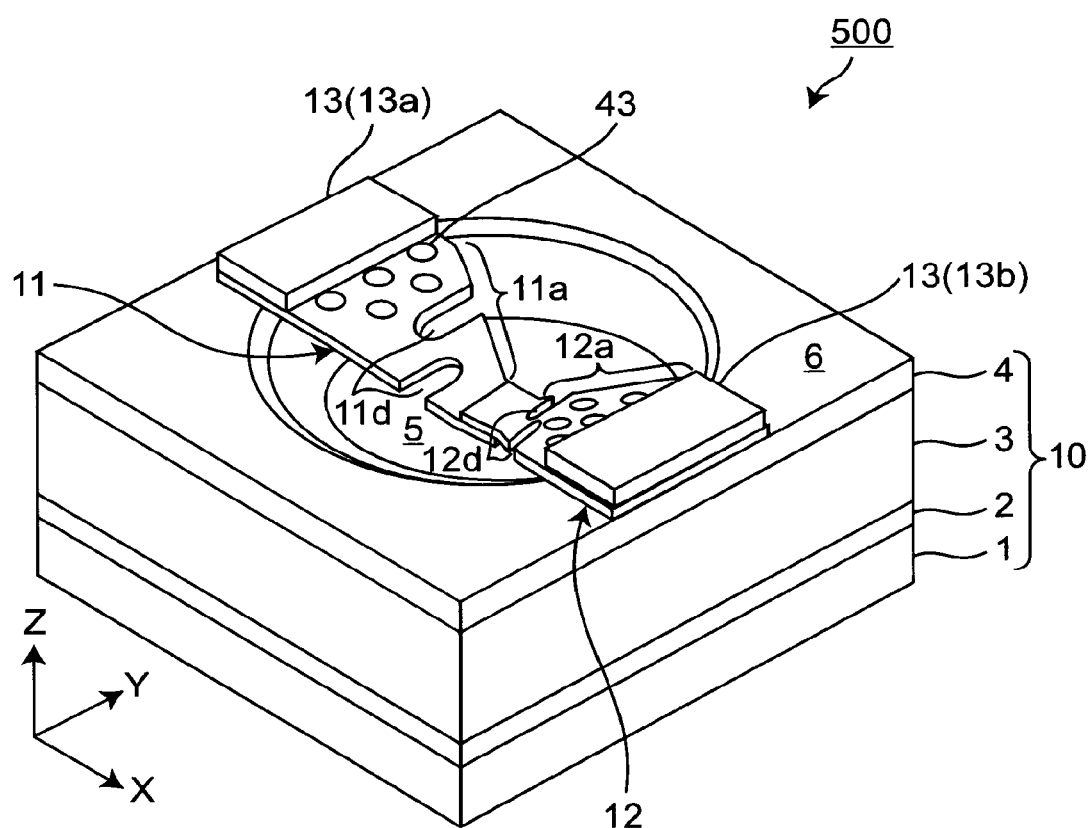
FIG. 16 is a perspective view of one unit of a thermoelectric converter according to the fifth embodiment of the present invention.

FIG. 16 is a perspective view of one unit of a thermoelectric converter according to the fifth embodiment of the present invention. FIG. 16 corresponds to FIG. 2. In one unit of a thermoelectric converter 500 according to the fifth embodiment, the bridge 11*a* of the thermoelectric element 11 includes two cut-out portions 11*d* and extends in a meandering way when viewed from the top or from the z-direction. This facilitates the thermoelectric element 11 to receive thermal stress (i.e. compressive stress) through easy deflection across the bridge 11*a*. Similarly, the thermoelectric element 12 includes cut-out portions 12*d* in the bridge 12*a*. The cut-out portions may be replaced with depressed portions having a planar shape similar to the cut-out portions but being thinner than the other portions of the thermoelectric elements 11, 12. It is not necessary that two cut-out portions 11*d*, 12*d* are provided, but one or more cut-out portions may be provided.

According to the fifth embodiment, even if the thermoelectric elements 11, 12 are subjected to a large temperature difference and extend due to the difference of the linear expansion coefficients therebetween, the extension can easily be absorbed by the deflection of the bridges 11*a*, 12*a*, which further improves a reliability of the thermoelectric converter.

Sixth Embodiment

Figure 17:
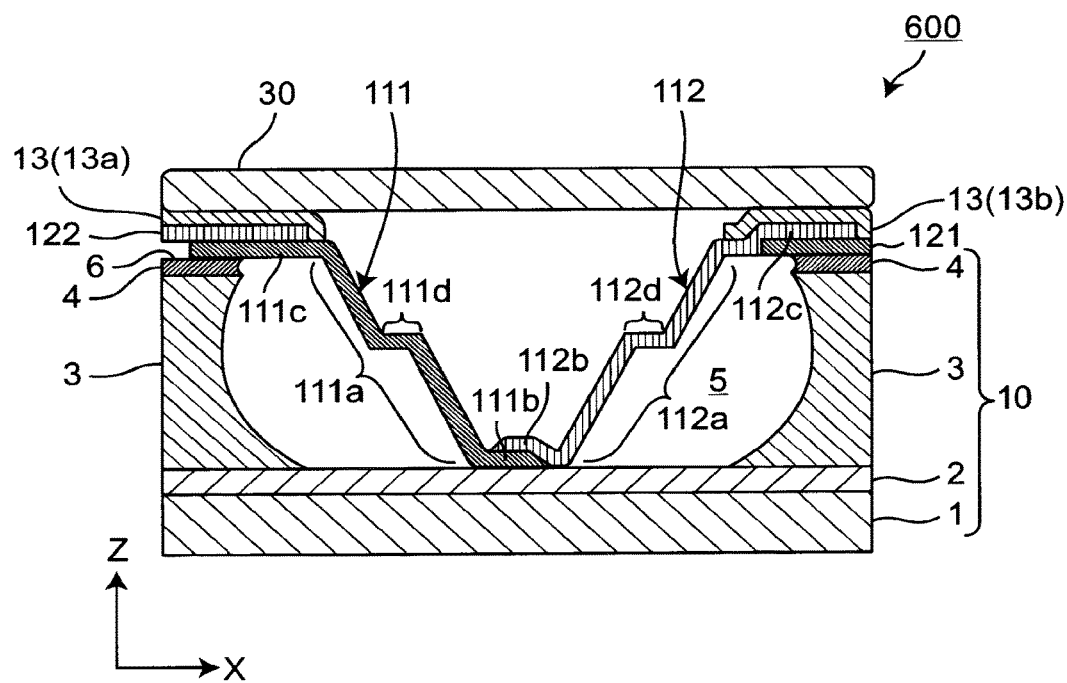
FIG. 17 is a cross sectional view of one unit of a thermoelectric converter according to the sixth embodiment of the present invention.

FIG. 17 is a cross sectional view of one unit of a thermoelectric converter according to the sixth embodiment of the present invention. FIG. 17 corresponds to FIG. 1. In one unit of a thermoelectric converter 600 of this embodiment, bridges 111*a*, 112*a* of thermoelectric elements 111, 112 have bent portions 111*d*, 112*d* formed in a stepwise configuration. The thermoelectric elements 121, 122 shown in FIG. 17 are provided on one unit next to another unit where the thermoelectric elements 111, 112 are provided.

Figure 18:
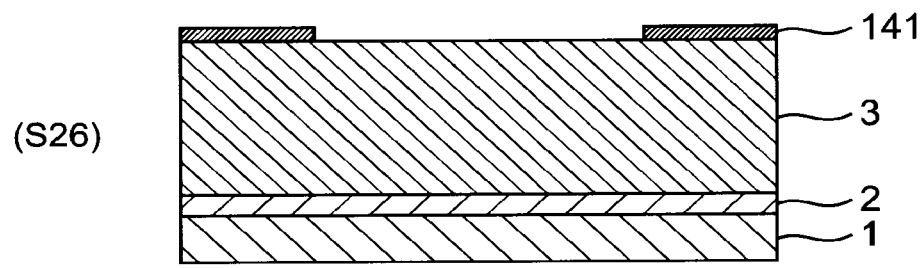
FIG. 18 is a cross sectional view of manufacturing steps S26 to S29 of the thermoelectric converter according to the sixth embodiment of the present invention.
Figure 18:
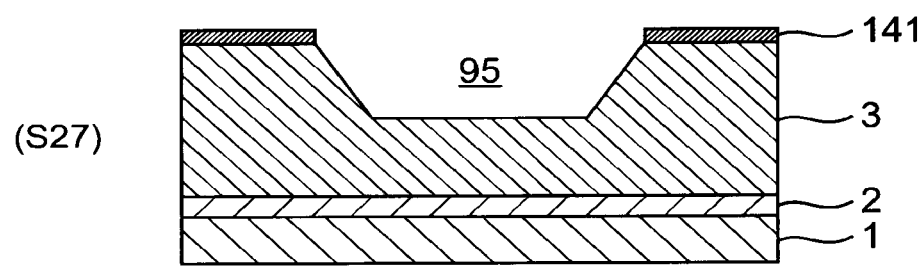
Figure 18:
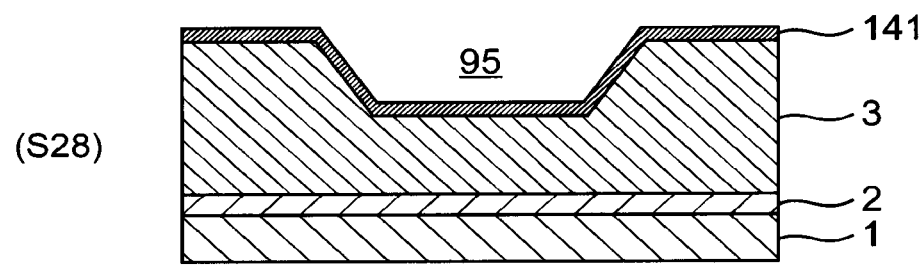
Figure 18:
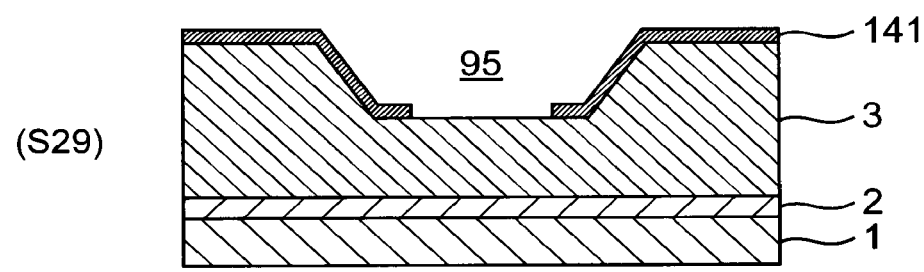
Figure 19:
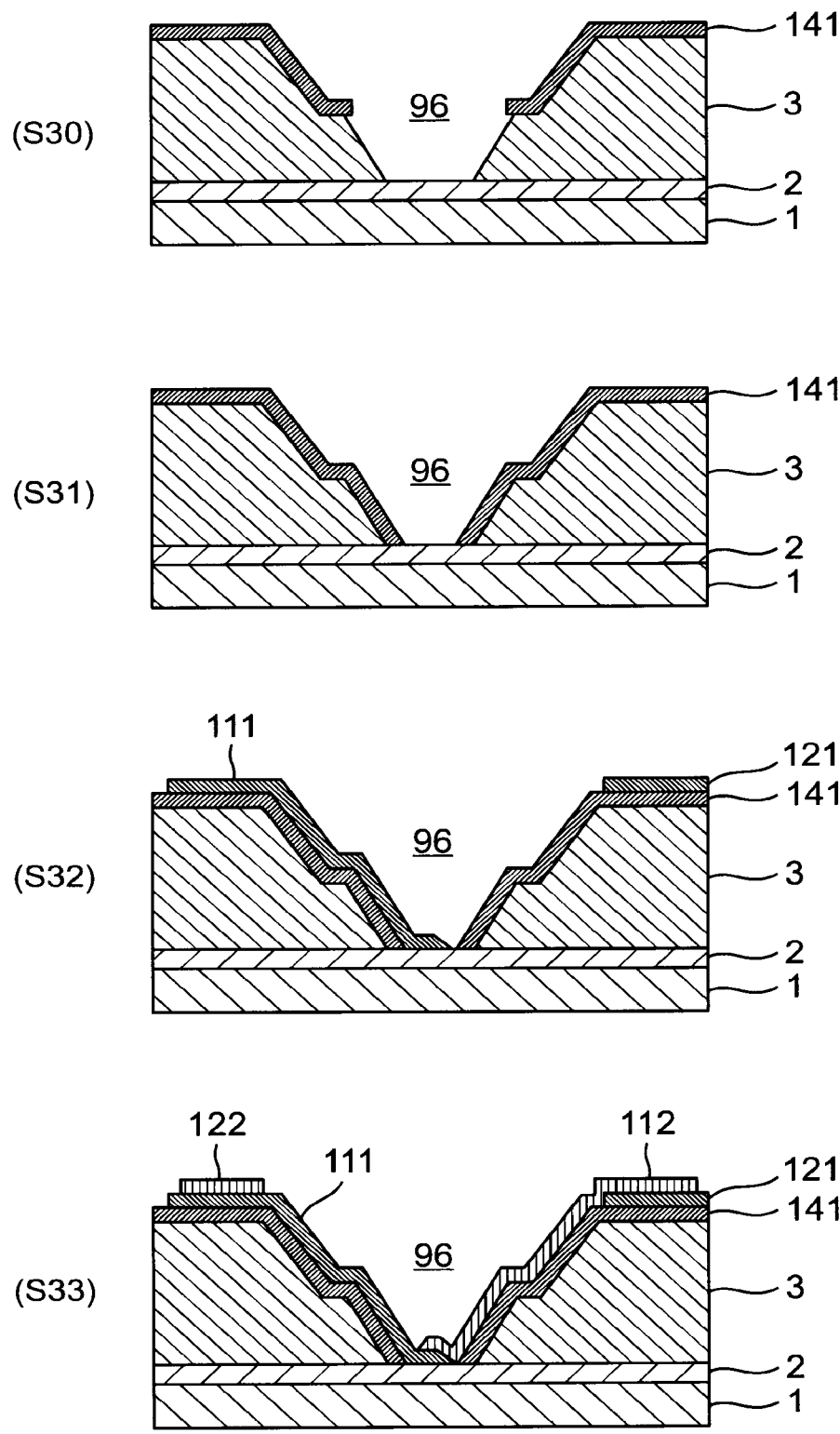
FIG. 19 is a cross sectional view of manufacturing steps S30 to S33 of the thermoelectric converter according to the sixth embodiment of the present invention.
Figure 20:
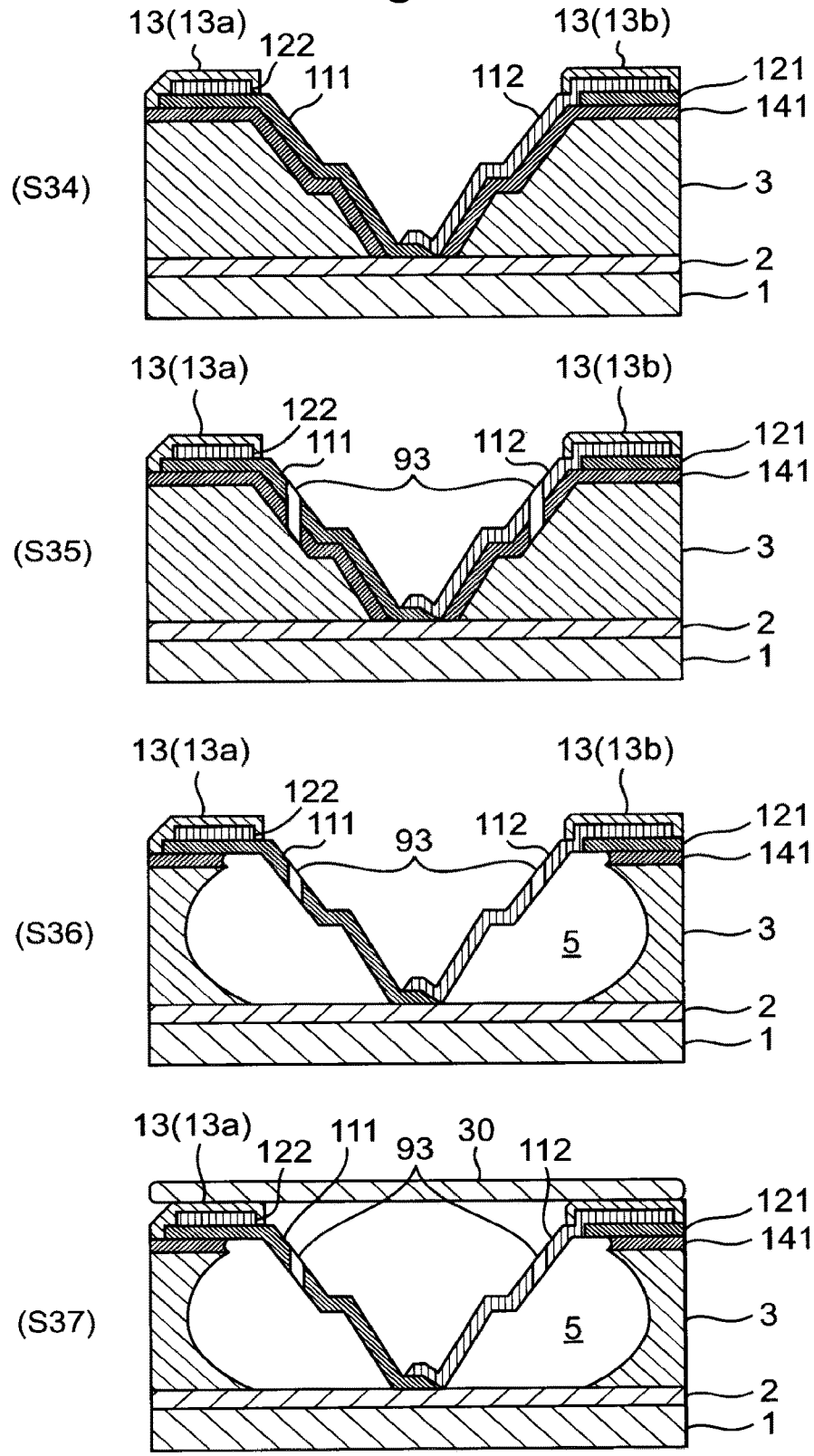
FIG. 20 is a cross sectional view of manufacturing steps S34 to S37 of the thermoelectric converter according to the sixth embodiment of the present invention.

With reference to FIGS. 18 to 20, an exemplary manufacturing method of a thermoelectric converter according to the sixth embodiment will be described herein. First, as described with reference to FIGS. 5 and 6, steps S21 to S26 corresponding to the steps S1 to S6, respectively are implemented to prepare a structure as depicted on top of FIG. 18.

The steps S27 to S29 are described with reference to FIG. 18.

(S27) KOH is used for anisotropic etching on the Si layer 3 to partly remove the Si layer 3. In this step, concentration, composition and/or amount of the etchant are adjusted to define an etch depth, without use of the lower insulating film 2 as the etch stop film as in the step S7 illustrated in FIG. 6, in order to form a first recess 95 having a inclined side wall and a bottom surface in the Si layer 3 as depicted.

(S28) A surface portion of the Si layer 3, which is exposed on the inclined side wall and the bottom surface, is oxidized to form a $SiO_2$ film 141 in a conformal way on the surface of the Si layer 3.

(S29) A central portion of a bottom surface of the first recess 95 in the $SiO_2$ film 141 is removed using a lithographic process to form a mask for an etching performed in a following step S30.

The steps S30 to S33 are described with reference to FIG. 19.

(S30) Tetramethylammonium hydroxide or TMAH is used for anisotropic etching on the Si layer 3. In this step, the lower insulating film 2 is used as an etch stop film. This further recesses a region below the first recess 95 to form a second recess 96 having a stepwise sidewall.

(S31) A surface portion of the Si layer 3 exposed to the tilted side wall of the second recess is oxidized to form a $SiO_2$ layer 141 in a conformal way on the surface of the Si layer 3.

(S32) PLD is used to deposit p-type or n-type thermoelectric material having the thickness between about 0.2 micron and a few microns. A lithographic process is subsequently performed to form a thermoelectric element 111 or 121.

(S33) Thermoelectric material, which has a conductive type different from that of the thermoelectric material deposited in the step S32, is deposited to form a thermoelectric element 112 or 122 using a lithographic process in the same way as the step S32.

The steps S34 to S37 are described with reference to FIG. 20.

(S34) A conductor such as metal, from which the electrode 13 is made, is deposited on the thermoelectric elements 111, 112 or the thermoelectric elements 121, 121.

(S35) A through hole 93 is formed in the thermoelectric elements 111, 112 using a lithographic process.

(S36) Etchant is provided below the thermoelectric material via the through hole 93 to perform isotropic etching on the Si layer 3, so that the Si layer 3 and the upper insulating film 4 are partly removed in their portions below the tilted side wall of the second recess 96. In this embodiment, the upper insulating film 4 is formed by the $SiO_2$ film 141. As such, the concave portion 5 is formed and the bridges 111*a* and 112*a* of the thermoelectric elements 111, 112 are positioned to bridge in a space defined within the concave portion 5. In this step, the etchant may be a mixed acid based upon hydrofluoric acid and including an appropriate amount of nitric acid.

(S37) A lid 30 is bonded thereon.

According to this embodiment, the thermoelectric elements 111, 112 to which thermal stress is applied are limited in their deflection direction, which decreases a variation in an output from the thermoelectric converter or the thermoelectric converting module and consequently improves a reliability of the thermoelectric converter.

Seventh Embodiment

Figure 21:
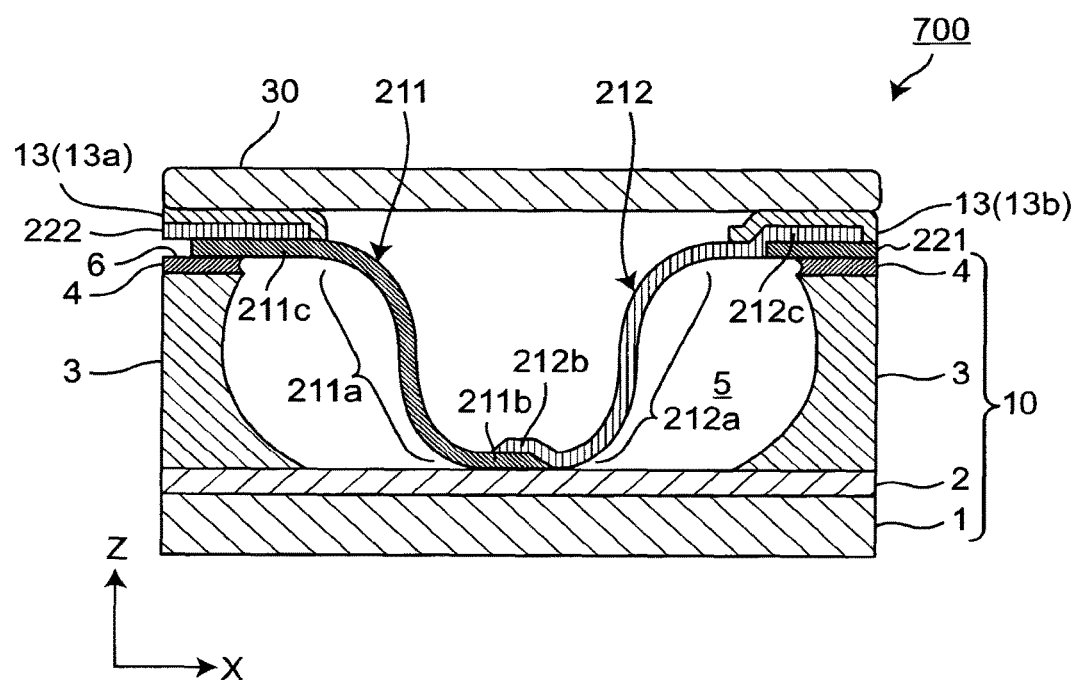
FIG. 21 is a cross sectional view of one unit of a thermoelectric converter according to the seventh embodiment of the present invention.

FIG. 21 depicts a cross sectional view of one unit of the thermoelectric converter according to the seventh embodiment of the present invention. FIG. 21 corresponds to FIGS. 1 and 17. In this embodiment, one unit of a thermoelectric converter 700 includes thermoelectric elements 211, 212 having bridges 211*a*, 212*a* with a smoothly curved shape. The curved portion is accomplished by the control of PLD condition in the steps S10 and S11 described with reference to FIG. 7, such as pressure of atmosphere gas, temperature of the substrate, laser intensity irradiated and frequency of pulses, such that film stress applied to thermoelectric elements is compressive stress. When compressive stress as film stress is applied to thermoelectric elements, the etching step S14 on the Si layer 3 described with reference to FIG. 8 forms the thermoelectric elements having a curved shape as depicted.

According to the seventh embodiment, the thermoelectric elements 211, 212 are limited in their deflection direction upon receiving thermal stress so as to reduce variation in an output from the thermoelectric converter or the thermoelectric converting module and thereby to improve a reliability of the thermoelectric converter.

When thermoelectric material is deposited using sputtering in the steps S10 and S11, sputtering condition such as pressure of sputtering gas and deposition temperature is controlled to apply compressive stress as film stress to the thermoelectric elements 211, 212.

It should be understood that the present invention is not limited to the above described embodiments. Any features described in the embodiments may be combined to each other, modified, or omitted as necessary. For example, in the above embodiments, the thermoelectric converter 200 is configured for a thermoelectric generation by Seebeck effect. Alternatively, thermoelectric converter 200 may be configured to cause temperature difference by Peltier effect. The flat portion and the concave portion of the substrate are examples of first and second regions having different heights each other. Thus, a slit may be formed instead of the concave portion in the substrate.

DESCRIPTION OF REFERENCE SYMBOLS 1 metal foil
2 lower insulating film
3 Si layer
4 upper insulating film
5 concave portion
6 flat portion
10 substrate
11, 12 (21, 22) thermoelectric element
13 electrode
30 lid
43 through hole
45 recess
51 Si (110) layer
52 oxidation film
53 Si (100) layer
54 insulating film
62 wiring member
70 engine
71 intake pipe
72 exhaust pipe
80 EGR cooler
90 EGR valve
100 thermoelectric converter (one unit)
200 thermoelectric converter
210 wire
300 thermoelectric converting module

The invention claimed is:

1. A thermoelectric converter, comprising:
a substrate including first and second regions having different heights than each other; and
a thermoelectric element including higher and lower temperature ends that are in physical contact with the first and second regions, respectively, the thermoelectric element including a bridge provided in an open space defined between the first and second regions in midair,
wherein the substrate includes a concave portion, and wherein the bridge is suspended across the concave portion.

2. A thermoelectric converter according to claim 1, wherein the substrate includes on an upper surface thereof the concave portion having a bottom surface and a flat portion lacking the concave portion therein, and one of the first and second regions is provided on the flat portion and the other one of the first and second regions is provided on the bottom surface of the concave portion.

3. A thermoelectric converter according to claim 1, wherein one of the higher and lower temperature ends of the thermoelectric element is in contact with another thermoelectric element having a conductivity type different from one of the thermoelectric element, and the other of higher and lower temperature ends is in contact with a conductor.

4. A thermoelectric converter according to claim 1, wherein the substrate is a silicon-on-insulator substrate including two silicon layers and an insulating layer sandwiched between the two silicon layers, and wherein upper surfaces of the two silicon layers have crystalline orientations that are different from each other.

5. A thermoelectric converter according to claim 1, wherein the thermoelectric converter is provided in an automobile having an engine and between a higher temperature pipe connected to an exhaust pipe of the engine and a lower temperature pipe through which coolant passes.

6. A thermoelectric converter according to claim 1, wherein the thermoelectric element includes at least one of:
a p-type thermoelectric material selected from the group consisting of 1) Ag-doped $Mg_2Si$, 2) Mn-doped or Al-doped $\beta$-$FeSi_2$, 3) $MnSi_2$, 4) FeSb based material, and 5) PbTe based material; and
an n-type thermoelectric material selected from the group consisting of Al-doped, Sb-doped or Bi-doped $Mg_2Si$, 2) Co-doped, Ni-doped or B-doped $\beta$-$FeSi_2$, 3) $CoSi_2$, 4) CoSb based material, and 5) PbTe based material.

7. A thermoelectric converter according to claim 1, wherein the thermoelectric element includes ZnO in which Al or $In_2O_3$ is doped.

8. A thermoelectric converter according to claim 1, wherein the bridge of the thermoelectric element includes a cut-out portion.

9. A thermoelectric converter according to claim 1, wherein the bridge of the thermoelectric element includes a first cut-out portion provided in a first side of the bridge and a second cut-out portion provided in a second side opposite to the first side of the bridge.

10. A thermoelectric converter according to claim 1, wherein the thermoelectric element includes one selected from the group consisting of a bent portion and a curved portion formed in the bridge.

11. A method for manufacturing a thermoelectric converter according to claim 1, comprising:
preparing a substrate;
performing an anisotropic etching on the substrate;
depositing a thermoelectric material on the substrate;
performing an anisotropic etching on the substrate to form a concave portion therein so that the thermoelectric material is suspended across in the concave portion.

12. A thermoelectric converter according to claim 1, wherein a surface of the bridge facing to the second region does not contact the substrate.

* * * * *